(12) United States Patent
Wang

(10) Patent No.: US 11,638,963 B2
(45) Date of Patent: May 2, 2023

(54) STRUCTURE FOR RETAINING FASTENING ELEMENT SOLDER

(71) Applicant: DTECH PRECISION INDUSTRIES CO., LTD., New Taipei (TW)

(72) Inventor: Ting-Jui Wang, New Taipei (TW)

(73) Assignee: DTECH PRECISION INDUSTRIES CO., LTD., New Taipei (TW)

(*) Notice: Subject to any disclaimer, the term of this patent is extended or adjusted under 35 U.S.C. 154(b) by 380 days.

(21) Appl. No.: 16/735,725

(22) Filed: Jan. 7, 2020

(65) Prior Publication Data

US 2020/0215632 A1 Jul. 9, 2020

(30) Foreign Application Priority Data

Jan. 9, 2019 (TW) ................ 108100914

(51) Int. Cl.
*B23K 1/00* (2006.01)
*F16B 19/00* (2006.01)
*H05K 1/18* (2006.01)
*F16B 19/02* (2006.01)
*B23K 101/42* (2006.01)

(52) U.S. Cl.
CPC ............ *B23K 1/0008* (2013.01); *F16B 19/02* (2013.01); *H05K 1/181* (2013.01); *B23K 2101/42* (2018.08); *H05K 2201/10598* (2013.01)

(58) Field of Classification Search
CPC .............. B23K 1/0008; B23K 2101/42; B23K 2101/18; B23K 2103/00; B23K 2103/18; B23K 2103/42; B23K 1/008; B23K 33/00; B23K 37/0408; H05K 1/181; H05K 2201/10598; H05K 1/02; H05K 2201/09063; H05K 2201/10409; F16B 37/061; F16B 19/02
See application file for complete search history.

(56) References Cited

U.S. PATENT DOCUMENTS 2,426,653 A * 9/1947 Whelan ................ F16B 37/048
 228/56.3
8,105,002 B2 * 1/2012 Hsieh .................... H05K 3/341
 228/168

(Continued)

FOREIGN PATENT DOCUMENTS

CN 201439793 U * 4/2010 ............ F16B 37/061
CN 205271197 U * 6/2016

(Continued)

*Primary Examiner* — Kiley S Stoner

(57) ABSTRACT

A structure and method for retaining fastening element solder are introduced. The structure includes a fastening element which has a solderable surface and a fastening portion or a hole portion. One end of the hole portion or the fastening portion has a retaining portion. During a soldering heating process, solder flows into or enters the retaining portion to cool down and solidify. The solidified solder is retained in the retaining portion. The fastening element is firmly coupled to a first object because of coordination between the solderable surface and the retaining portion, and the second object is coupled to or removed from the fastening element because of coordination between the fastening portion and the hole portion, so as to couple together and separate the first and second objects repeatedly and quickly.

3 Claims, 13 Drawing Sheets

(56) References Cited

U.S. PATENT DOCUMENTS

| | | | | |
|---|---|---|---|---|
| 11,145,995 B2 * | 10/2021 | Blumenschein | ....... | H01R 4/028 |
| 2003/0099524 A1 * | 5/2003 | Chen | ..................... | F16B 37/048 |
| | | | | 411/429 |
| 2004/0100777 A1 * | 5/2004 | Lee | ........................ | H05K 3/301 |
| | | | | 361/758 |
| 2004/0258500 A1 * | 12/2004 | Ireland | ................... | H05K 3/325 |
| | | | | 29/842 |
| 2005/0272307 A1 * | 12/2005 | Chen | .................. | H01L 23/4006 |
| | | | | 257/E23.084 |
| 2010/0003104 A1 * | 1/2010 | Wang | .................... | F16B 37/061 |
| | | | | 411/103 |
| 2010/0226731 A1 * | 9/2010 | Hsieh | .................... | H05K 3/341 |
| | | | | 411/171 |
| 2010/0290860 A1 * | 11/2010 | Wang | .................... | F16B 5/0208 |
| | | | | 411/105 |
| 2011/0121054 A1 * | 5/2011 | Chiu | ........................ | B23K 1/18 |
| | | | | 228/44.3 |
| 2014/0057731 A1 * | 2/2014 | Stephens | ................ | H05K 3/341 |
| | | | | 470/25 |
| 2015/0198043 A1 * | 7/2015 | Striedelmeyer | ......... | F01D 5/025 |
| | | | | 219/616 |
| 2020/0269337 A1 * | 8/2020 | Hiyama | ................ | F16J 15/025 |
| 2021/0207642 A1 * | 7/2021 | Wang | ..................... | B23K 31/02 |

FOREIGN PATENT DOCUMENTS

| | | | | |
|---|---|---|---|---|
| CN | 106855074 A | | 6/2017 | |
| CN | 107288962 A | | 10/2017 | |
| DE | 10143915 A1 | * | 3/2003 | ............... B23K 1/00 |
| DE | 102004025493 A1 | * | 12/2005 | ........... B23K 1/0004 |
| DE | 102004043627 B4 | * | 8/2007 | ........... B23K 1/0008 |
| DE | 102009036025 A1 | * | 2/2011 | ........... H01R 12/515 |
| JP | S6227214 U | * | 2/1987 | |
| JP | H0631165 U | * | 4/1994 | |
| JP | 10255880 A | * | 9/1998 | |
| JP | 2004079975 A | * | 3/2004 | |
| KR | 20170132001 A | | 12/2017 | |
| TW | 201736738 A | | 10/2017 | |

\* cited by examiner

16

(a)

(b)

(c)

STRUCTURE FOR RETAINING FASTENING ELEMENT SOLDER

CROSS-REFERENCE TO RELATED APPLICATION

This non-provisional application claims priority under 35 U.S.C. § 119(a) on Patent Application No(s). 108100914 filed in Taiwan, R.O.C. on Jan. 9, 2019, the entire contents of which are hereby incorporated by reference.

BACKGROUND OF THE INVENTION

1. Field of the Invention

The present disclosure relates to a structure and method for retaining fastening element solder, and in particular to a structure and method for retaining fastening element solder to couple together and separate at least two objects repeatedly and quickly.

2. Description of the Related Art

Conventionally, coupling together at least two objects is usually achieved by screws.

Although the prior art is effective in coupling together at least two objects in an inseparable way, it has a drawback: the objects thus coupled together are not firmly fixed in place after the assembly.

Therefore, it is important to provide a structure and method for retaining fastening element solder to not only allow a fastening element to be firmly coupled to a first object but also allow a second object to be coupled to or removed from the fastening element, so as for the first and second objects to be coupled together and separated repeatedly and quickly.

BRIEF SUMMARY OF THE INVENTION

An objective of the present disclosure is to provide a structure and method for retaining fastening element solder to not only allow a fastening element to be firmly coupled to a first object but also allow a second object to be coupled to or removed from the fastening element, so as for the first and second objects to be coupled together and separated repeatedly and quickly.

To achieve at least the above objective, the present disclosure provides a structure and method for retaining fastening element solder, comprising a fastening element, the fastening element having a solderable surface and a fastening portion or a hole portion, wherein an end of the hole portion or the fastening portion has a retaining portion which solder flows into or enters during a soldering heating process to cool down and solidifies, and the solidified solder is retained in the retaining portion.

Regarding the structure and method for retaining fastening element solder, the retaining portion is stepped, oblique, arcuate, curved, grooved, dented or hole-shaped.

Regarding the structure and method for retaining fastening element solder, the fastening portion is thread, inner thread, outer thread, outer fastening member, inner fastening member, hole member or groove member.

Regarding the structure and method for retaining fastening element solder, the fastening portion or the hole portion is a through hole or non-through hole.

Regarding the structure and method for retaining fastening element solder, the fastening portion or the hole portion is fastened to a second object, or the second object is fastened to the fastening portion or the hole portion.

Regarding the structure and method for retaining fastening element solder, the fastening element is carried by a carrier and taken out with a tool so as to be placed on a first object for soldering.

Regarding the structure and method for retaining fastening element solder, the fastening element is carried by a carrier and taken out with a tool such that the position of the fastening element is compared with that of a first object by a comparison device, allowing position-related information to be sent to the tool to enable the tool to place the fastening element at a soldering point on the first object precisely.

Regarding the structure and method for retaining fastening element solder, the fastening element has an intermediator, and the fastening element is carried by a carrier and taken out with a tool through the intermediator before being placed on a first object for soldering.

Regarding the structure and method for retaining fastening element solder, the fastening element has an intermediator, and the fastening element is carried by a carrier and taken out with a tool through the intermediator such that the position of the fastening element is compared with that of a first object by a comparison device, allowing position-related information to be sent to the tool to enable the tool to place the fastening element at a soldering point on the first object precisely.

Regarding the structure and method for retaining fastening element solder, the tool is a clamp, a vacuum suction device or a magnetic suction device.

Regarding the structure and method for retaining fastening element solder, the carrier has a cover.

Regarding the structure and method for retaining fastening element solder, the comparison device is an image comparison device, vision comparison device, distance comparison device or space comparison device.

Regarding the structure and method for retaining fastening element solder, the fastening element is soldered to a first object having a corresponding solderable surface such that, when heated up, solder between the solderable surface and the corresponding solderable surface turns liquid, wherein the liquid solder flows into the retaining portion to cool down and solidify, and the solidified solder is retained in the retaining portion.

Regarding the structure and method for retaining fastening element solder, the solder flows into the retaining portion and solidifies, and the solidified solder is retained in the retaining portion whereby the liquid solder resulting from heating is prevented from flowing into the hole portion or the fastening portion to cool down and solidify, thereby preventing a second object from causing interference after being fastened to or inserted into the fastening portion or the hole portion or preventing the solidified solder from falling off which might otherwise happen because of a collision.

Regarding the structure and method for retaining fastening element solder, the fastening element has a fitting portion, and both the retaining portion and the fitting portion have a solderable surface, or the whole surface of the fastening element is a solderable surface.

Regarding the structure and method for retaining fastening element solder, the fastening element has a fitting portion with a solderable surface, and the fitting portion is soldered to a first object.

Regarding the structure and method for retaining fastening element solder, the fitting portion is a stepped portion, raised portion, dented portion, flat surface portion, arcuate portion or curved portion.

Regarding the structure and method for retaining fastening element solder, the fitting portion is soldered to a through hole of the first object from inside or outside or to a flat surface of an end of the first object.

Regarding the structure and method for retaining fastening element solder, the fastening element is soldered to a first object, and the first object is a printed circuit board (PCB), a metal board or a plastic board.

Regarding the structure and method for retaining fastening element solder, the intermediator is a fastening member.

Regarding the structure and method for retaining fastening element solder, the fastening member is a threaded fastening member, cylindrical fastening member, outer fastening member, inner fastening member, hook fastening member or resilient fastening member.

Regarding the structure and method for retaining fastening element solder, the second object is a fastening member.

Regarding the structure and method for retaining fastening element solder, the second object is a threaded fastening member, cylindrical fastening member, outer fastening member, inner fastening member, hook fastening member or resilient fastening member.

Regarding the structure and method for retaining fastening element solder, the intermediator is a fastening member, a hook-and-loop member or an inserting member.

Regarding the structure and method for retaining fastening element solder, a predetermined solder layer is disposed between the solderable surface of the fastening element and the corresponding solderable surface of the first object.

Therefore, a structure and method for retaining fastening element solder according to the present disclosure has advantages as follows: a fastening element is firmly coupled to a first object because of coordination between a solderable surface and a retaining portion, and a second object is coupled to or removed from the fastening element because of coordination between a fastening portion and a hole portion, so as to couple together and separate the first and second objects repeatedly and quickly.

DETAILED DESCRIPTION OF THE INVENTION

To facilitate understanding of the object, characteristics and effects of this present disclosure, embodiments together with the attached drawings for the detailed description of the present disclosure are provided.

Figure 1:
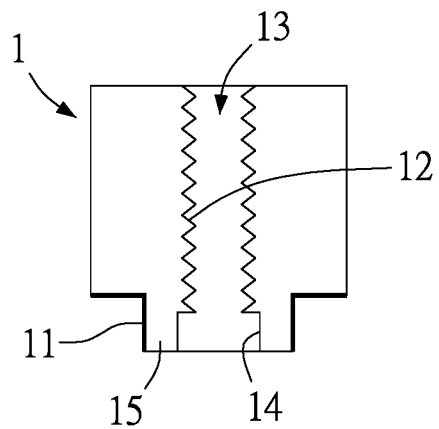
FIG. 1 is a cross-sectional view of the first embodiment of the present disclosure.
Figure 2:
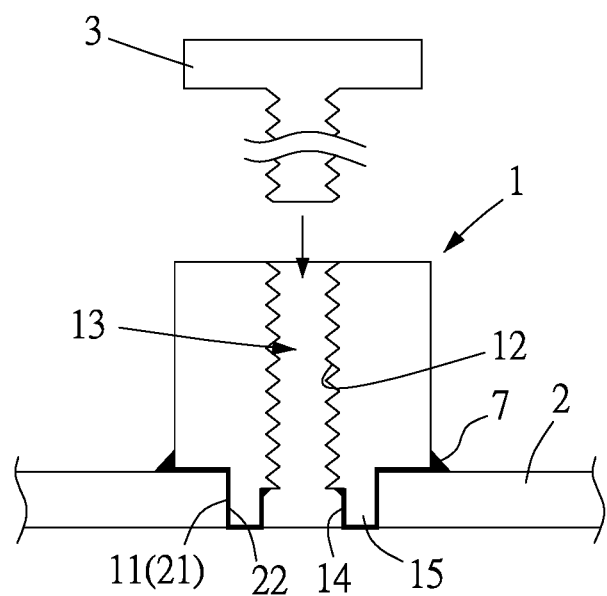
FIG. 2 is a schematic view of how to operate the first embodiment of the present disclosure.

Referring to FIG. 1 and FIG. 2, the present disclosure provides a structure and method for retaining fastening element solder. The structure for retaining fastening element solder comprises a fastening element 1. The fastening element 1 has a solderable surface 11, a fastening portion 12 and a hole portion 13. One end of the fastening portion 12 or the hole portion 13 has a retaining portion 14. During a soldering heating process, solder flows into the retaining portion 14 to cool down and turn into solid solder 7 which is retained in the retaining portion 14.

During an assembly process, the fastening element 1 is soldered to a first object 2. The first object 2 has a corresponding solderable surface 21. When heated up, the solder between the solderable surface 11 and the corresponding solderable surface 21 turns liquid such that the liquid solder flows into the retaining portion 14 to cool down and turn into the solid solder 7 which is retained in the retaining portion 14. Afterward, the fastening portion 13 or the hole portion 12 is fastened to a second object 3, or both the fastening portion 12 and the hole portion 13 are fastened to the second object 3. Therefore, liquid solder flows into the retaining portion 14 and solidifies so as to be retained therein, preventing the liquid solder from flowing into the fastening portion 12 or the hole portion 13 to cool down and solidify, and further preventing a second object 3 from causing interference after being fastened to or inserted into the fastening portion 12 or the hole portion 13 or preventing the solidified solder from falling off which might otherwise happen because of a collision. Therefore, the fastening element 1 is firmly coupled to the first object 2 because of coordination between the solderable surface 11 and the retaining portion 14, and the second object 3 is coupled to or removed from the fastening element 1 because of coordination between the fastening portion 12 and the hole portion 13, so as to couple together and separate the first and second objects 2, 3 repeatedly and quickly.

In the preferred embodiment of the present disclosure, the fastening element 1 has a fitting portion 15. The fitting portion 15 has a solderable surface 11. The fastening element 1 is soldered to the first object 2 because of coordination between the fitting portion 15 and the solderable surface 11. Both the retaining portion 14 and the fitting portion 15 have a solderable surface, or the whole surface of the fastening element 1 is a solderable surface (not shown), rendering the present disclosure versatile.

In the preferred embodiment of the present disclosure, the fitting portion 15 is soldered to a through hole 22 of the first object 2 from inside or outside or to the flat surface of one end of the first object 2. The fitting portion 15 is soldered to the through hole 22 of the first object 2 from inside, allowing the fastening element 1 to be firmly coupled to the first object 2.

In the preferred embodiment of the present disclosure, the fastening portion 12 is thread (i.e., inner thread in this embodiment, though a variant embodiment is exemplified by inner or outer thread). Alternatively, the fastening portion 12 is a hole member or groove member (not shown), the hole portion 13 is a through hole, whereas both the retaining portion 14 and the fitting portion 15 are a stepped portion. Therefore, the fastening element 1 is fastened to the second object 3 through the fastening portion 13 and the hole portion 12.

In the preferred embodiment of the present disclosure, the fastening element 1 is soldered to the first object 2. The first object 2 is a printed circuit board (PCB), metal board or plastic board. Therefore, according to the present disclosure, the fastening element 1 is applicable to the first object 2 regardless of the form thereof and thus is versatile.

Figure 3:
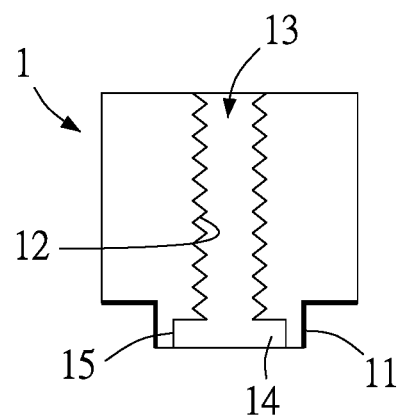
FIG. 3 is a cross-sectional view of the second embodiment of the present disclosure.
Figure 4:
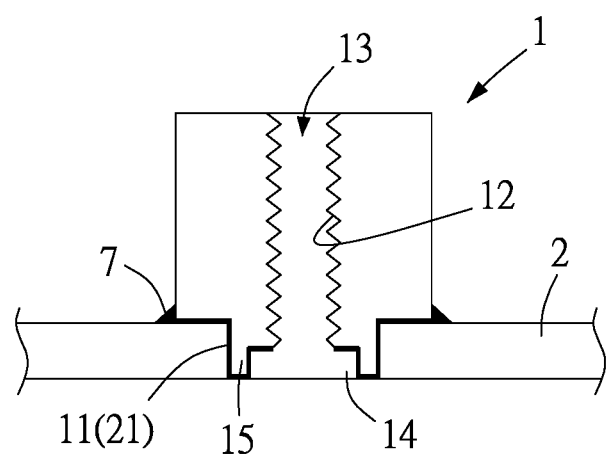
FIG. 4 is a schematic view of how to operate the second embodiment of the present disclosure.

Referring to FIG. 3 and FIG. 4, in the preferred embodiment of the present disclosure, the fastening portion 12 is a thread (i.e., inner thread in this embodiment, though a variant embodiment is exemplified by inner or outer thread), the hole portion 13 is a through hole, the retaining portion 14 is oblique, and the fitting portion 15 is a stepped portion. Therefore, the fastening element 1 is soldered to the first object 2. When heated up, the solderable surface 11 and the corresponding solderable surface 21 turn into liquid solder, and the liquid solder flows into the oblique retaining portion 14 to cool down and turn into the solid solder 7 which is retained in the retaining portion 14. Afterward, the fastening element 1 is fastened to a second object (not shown) through the fastening portion 13 or the hole portion 12, or both the fastening portion 12 and the hole portion 13 are fastened to the second object. Therefore, the fastening element 1, which is of variable form, couples together and separates the first object 2 and the second object repeatedly and quickly, rendering the present disclosure versatile.

Figure 5:
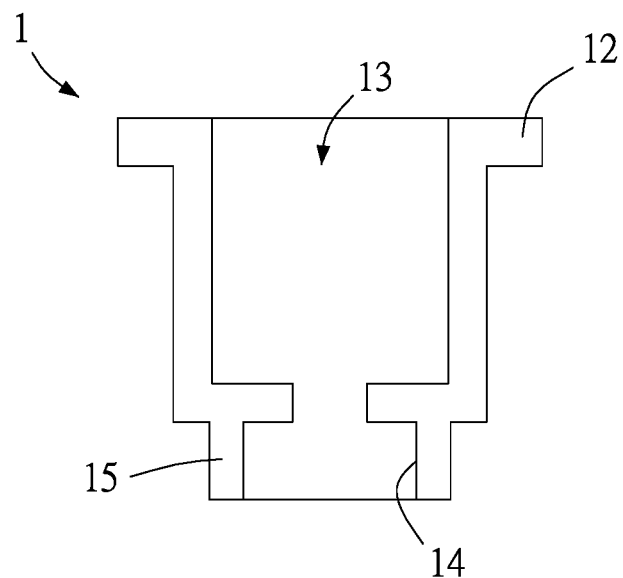
FIG. 5 is a cross-sectional view of the third embodiment of the present disclosure.

Referring to FIG. 5, in the preferred embodiment of the present disclosure, the fastening portion 12 is an outer fastening member, the hole portion 13 is a through hole, and both the retaining portion 14 and the fitting portion 15 are stepped portions. Therefore, the fastening element 1 of variable form is coupled to the first object (not shown) and fastened to the second object (not shown) through the fastening portion 13 and the hole portion 12, rendering the present disclosure versatile.

Figure 6:
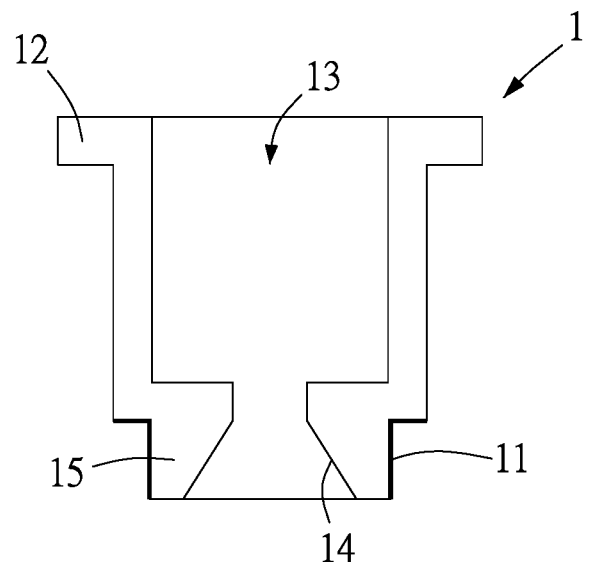
FIG. 6 is a cross-sectional view of the fourth embodiment of the present disclosure.
Figure 7:
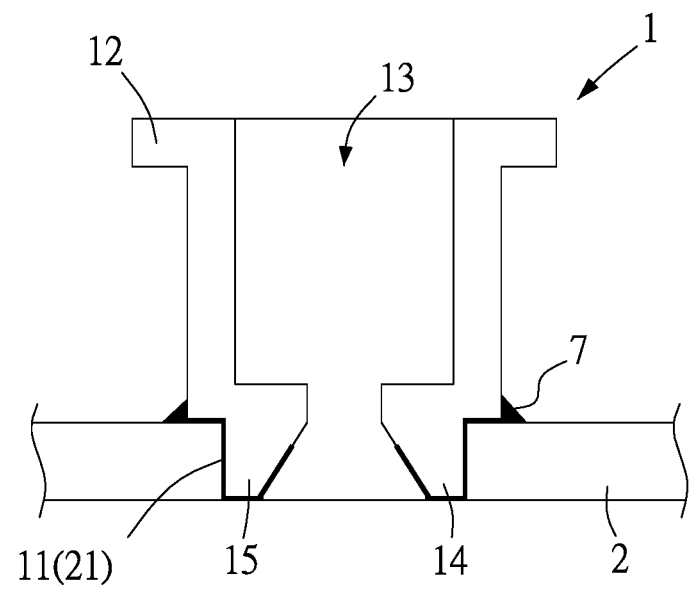
FIG. 7 is a schematic view of how to operate the fourth embodiment of the present disclosure.

Referring to FIG. 6 and FIG. 7, in the preferred embodiment of the present disclosure, the fastening portion 12 is an outer fastening member, the hole portion 13 is a through hole, the retaining portion 14 is oblique, and the fitting portion 15 is a stepped portion. Therefore, the fastening element 1 is soldered to the first object 2. When heated up, the solderable surface 11 and the corresponding solderable surface 21 turn into liquid solder, and the liquid solder flows into the oblique retaining portion 14 to cool down and turn into the solid solder 7 which is retained in the retaining portion 14. Afterward, through the fastening portion 13 or the hole portion 12 is fastened to a second object (not shown), or the second object is fastened to both the fastening portion 12 and the hole portion 13. Therefore, the fastening element 1 of variable form couples together and separates the first object 2 and the second object repeatedly and quickly, rendering the present disclosure versatile.

Figure 8:
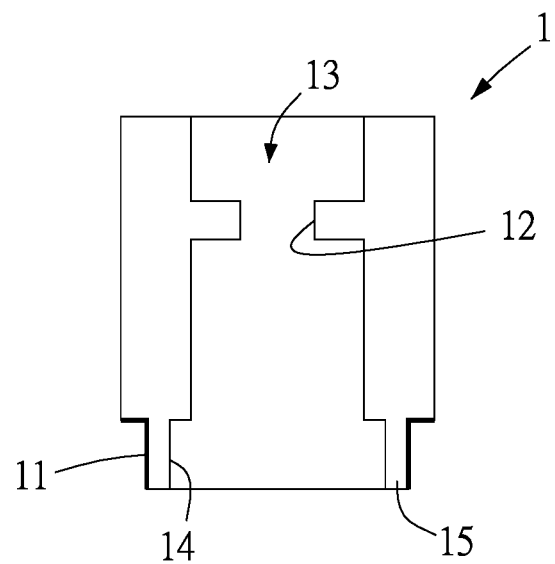
FIG. 8 is a cross-sectional view of the fifth embodiment of the present disclosure.
Figure 9:
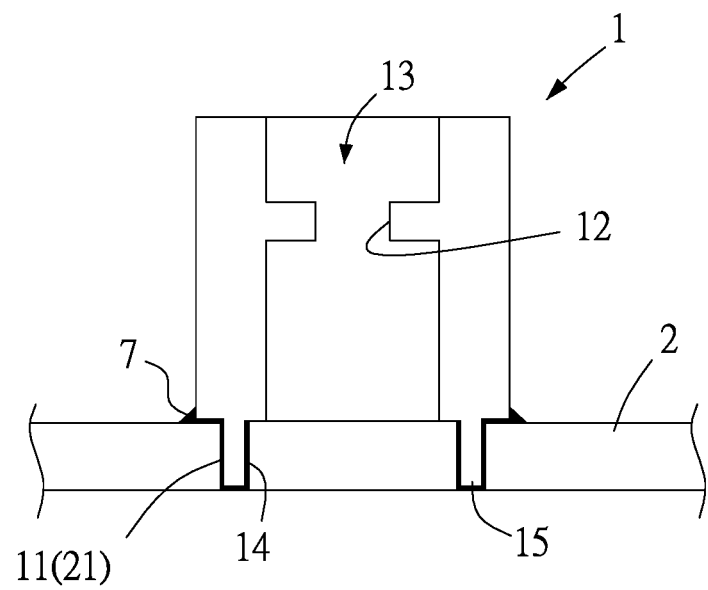
FIG. 9 is a schematic view of how to operate the fifth embodiment of the present disclosure.

Referring to FIG. 8 and FIG. 9, in the preferred embodiment of the present disclosure, the fastening portion 12 is an inner fastening member, the hole portion 13 is a through hole, and both the retaining portion 14 and the fitting portion 15 are a stepped portion. Therefore, the fastening element 1 is soldered to the first object 2. When heated up, the solderable surface 11 and the corresponding solderable surface 21 turn into liquid solder, and the liquid solder flows into the retaining portion 14 which is a stepped portion. The liquid solder cools down and turns into the solid solder 7 which is retained in the retaining portion 14. Afterward, the fastening element 1 is fastened to a second object (not shown) through the fastening portion 13 or the hole portion 12, or both the fastening portion 12 and the hole portion 13 are fastened to the second object. Therefore, the fastening element 1 of a variable form couples together and separates the first object 2 and the second object repeatedly and quickly, rendering the present disclosure versatile.

Figure 10:
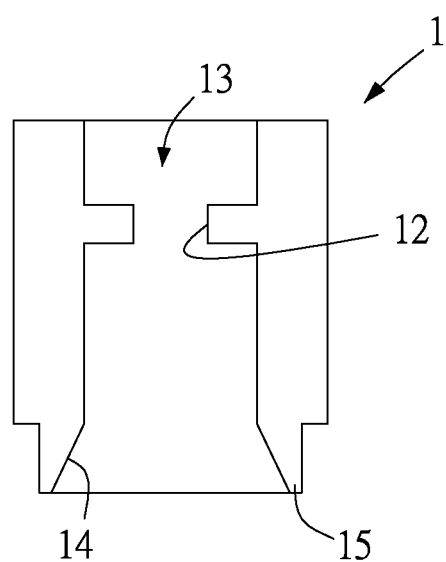
FIG. 10 is a cross-sectional view of the sixth embodiment of the present disclosure.

Referring to FIG. 10, in the preferred embodiment of the present disclosure, the fastening portion 12 is an inner fastening member, the hole portion 13 is a through hole, the retaining portion 14 is an oblique surface portion, and the fitting portion 15 is a stepped portion. Therefore, the fastening element 1 of a variable form is coupled to the first object (not shown) and fastened to the second object (not shown) through the fastening portion 13 and the hole portion 12, rendering the present disclosure versatile.

Figure 11:
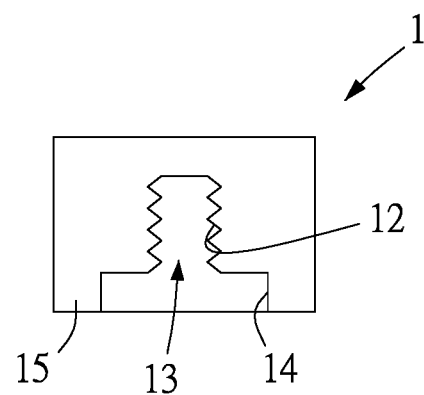
FIG. 11 is a cross-sectional view of the seventh embodiment of the present disclosure.

Referring to FIG. 11, in the preferred embodiment of the present disclosure, the fastening portion 12 is thread (i.e., inner thread in this embodiment, though a variant embodiment is exemplified by inner or outer thread), the hole portion 13 is a non-through hole, the retaining portion 14 is a stepped portion, and the fitting portion 15 is a flat surface portion. Therefore, the fastening element 1 of a variable form is coupled to the first object (not shown) and fastened to the second object (not shown) through the fastening portion 13 and the hole portion 12, rendering the present disclosure versatile.

Figure 12:
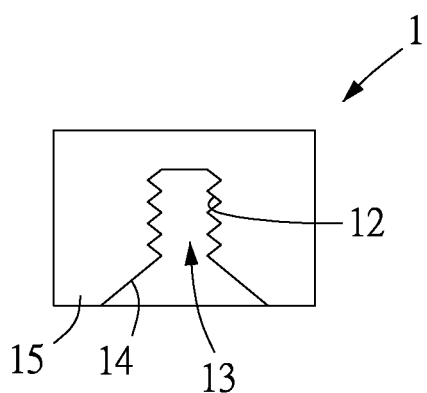
FIG. 12 is a cross-sectional view of the eighth embodiment of the present disclosure.

Referring to FIG. 12, in the preferred embodiment of the present disclosure, the fastening portion 12 is thread (i.e., inner thread in this embodiment, though a variant embodiment is exemplified by inner or outer thread), the hole portion 13 is a non-through hole, the retaining portion 14 is an oblique surface portion, and the fitting portion 15 is a flat surface portion. Therefore, the fastening element 1 of a variable form is coupled to the first object (not shown) and fastened to the second object (not shown) through the fastening portion 13 and the hole portion 12, rendering the present disclosure versatile.

Figure 13:
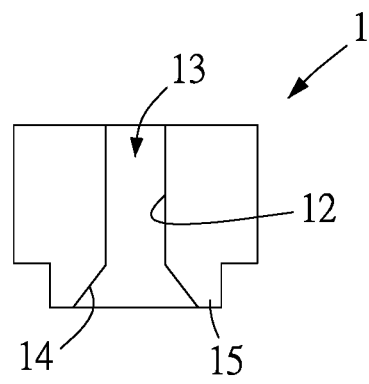
FIG. 13 is a cross-sectional view of the ninth embodiment of the present disclosure.

Referring to FIG. 13, in the preferred embodiment of the present disclosure, the fastening portion 12 and the hole portion 13 are through holes in communication with each other, the retaining portion 14 is an oblique surface portion, and the fitting portion 15 is a stepped portion. Therefore, the fastening element 1 of variable form is coupled to the first object (not shown) and fastened to the second object (not shown) through the fastening portion 13 and the hole portion 12, rendering the present disclosure versatile.

Figure 14:
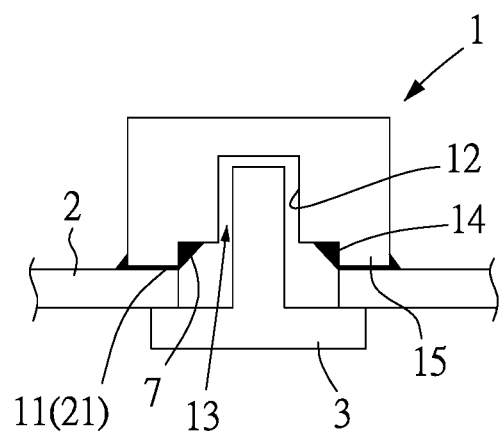
FIG. 14 is a schematic view of how to operate the tenth embodiment of the present disclosure.

Referring to FIG. 14, in the preferred embodiment of the present disclosure, the fastening portion 12 is an inner fastening member, the hole portion 13 is a non-through hole, the retaining portion 14 is a stepped portion, and the fitting portion 15 is a flat surface portion. Therefore, the fastening element 1 is soldered to the first object 2. When heated up, the solderable surface 11 and the corresponding solderable surface 21 turn into liquid solder, and the liquid solder flows into the retaining portion 14 which is a stepped portion to cool down and turn into the solid solder 7 which is retained in the retaining portion 14. Afterward, the fastening element 1 is fastened to the second object 3 through the fastening portion 13 and the hole portion 12, or the second object 3 is fastened to both the fastening portion 12 and the hole portion 13. Therefore, the fastening element 1 of variable form couples together and separates the first object 2 and the second object 3 repeatedly and quickly, rendering the present disclosure versatile.

Figure 15:
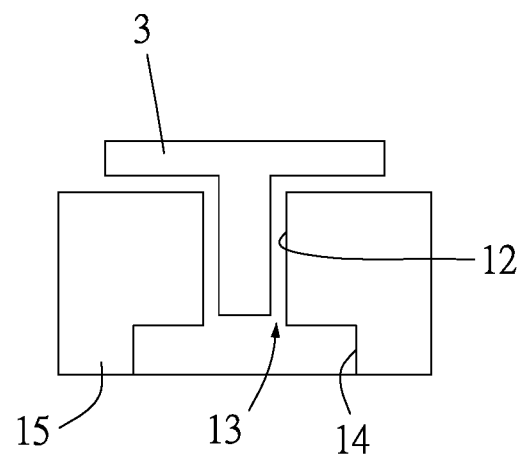
FIG. 15 is a schematic view of how to operate the eleventh embodiment of the present disclosure.

Referring to FIG. 15, in the preferred embodiment of the present disclosure, the fastening portion 12 and the hole portion 13 are through holes in communication with each other, the retaining portion 14 is a stepped portion, and the fitting portion 15 is a flat surface portion. Therefore, after the fastening element 1 has been soldered to the first object (not shown), the fastening element 1 is fastened to the second object 3 through the fastening portion 13 and the hole portion 12, or the second object 3 is fastened to both the fastening portion 12 and the hole portion 13. Therefore, the fastening element 1 of variable form couples together and separates the first object and the second object 3 repeatedly and quickly, rendering the present disclosure versatile.

The retaining portion 14 is arcuate, curved, grooved, dented or hole-shaped, whereas the fitting portion 15 is a raised portion, dented portion, arcuate portion or curved portion (not shown). Therefore, the present disclosure is versatile.

Figure 16:
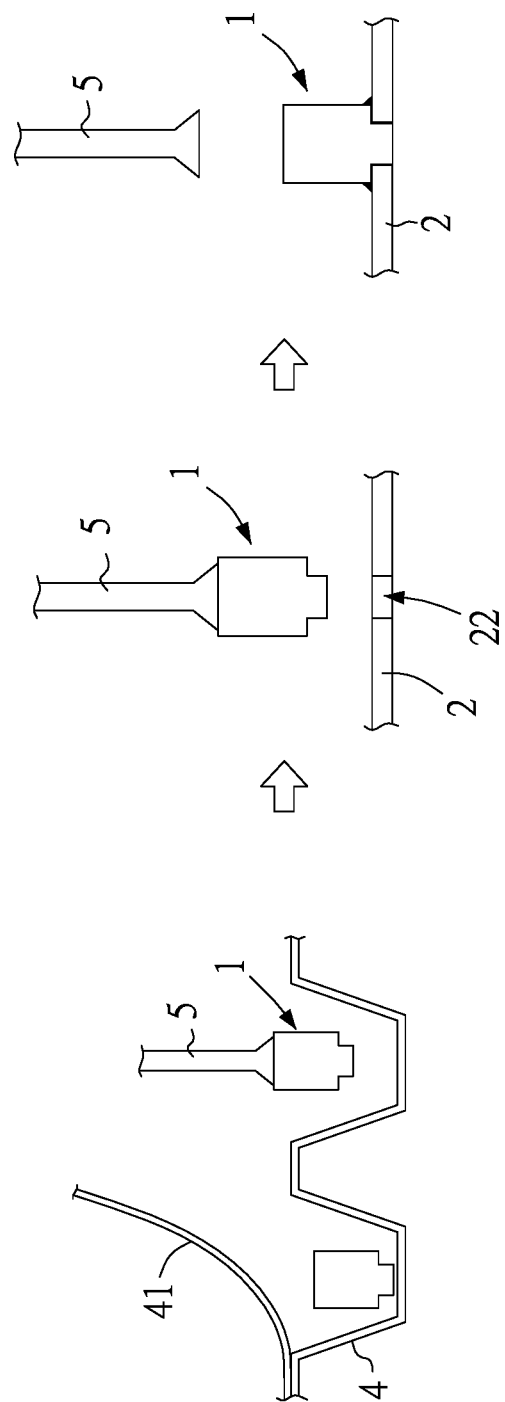
FIG. 16 is a schematic view of how to operate the twelfth embodiment of the present disclosure.

Referring to FIG. 16, in the preferred embodiment of the present disclosure, the fastening element 1 is carried by a carrier 4 and taken out with a tool 5 so as to be placed at the through hole 22 of the first object 2 for soldering.

In the preferred embodiment of the present disclosure, the carrier 4 has a cover 41, and the cover 41 seals the fastening element 1 in the carrier 4, achieving storage.

In the preferred embodiment of the present disclosure, the tool 5 is a clamp, a vacuum suction device or a magnetic suction device, so as to be chosen for use as needed.

Figure 17:
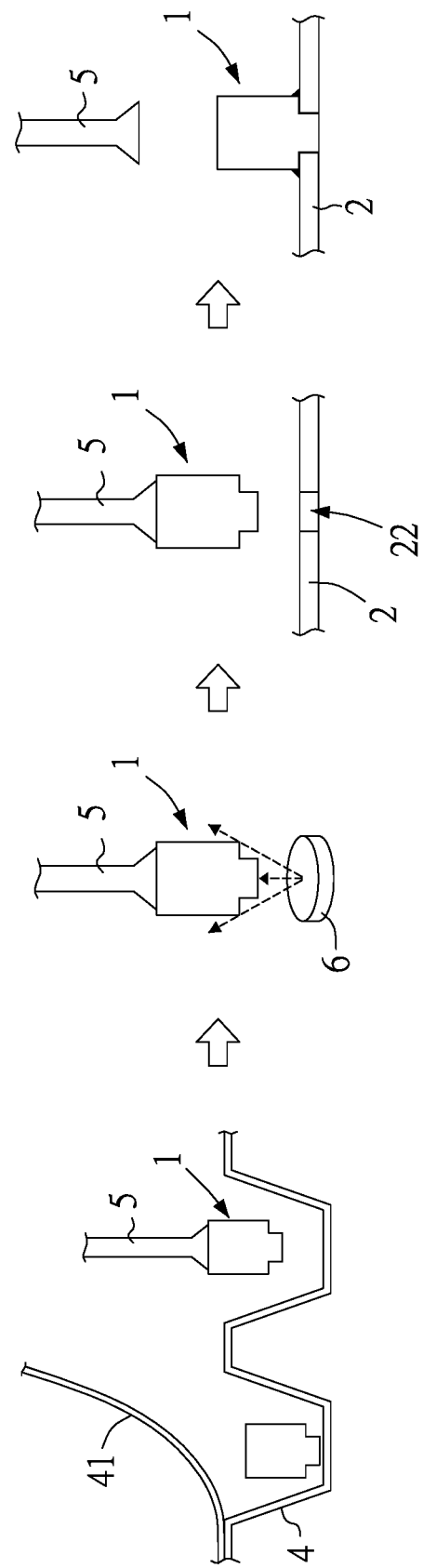
FIG. 17 is a schematic view of how to operate the thirteenth embodiment of the present disclosure.

Referring to FIG. 17, in the preferred embodiment of the present disclosure, the fastening element is carried by a carrier 4 and taken out with the tool 5 such that the position of the fastening element 1 is compared with that of the first object 2 by a comparison device 6, allowing position-related information to be sent to the tool 5 to enable the tool 5 to place the fastening element 1 at a soldering point on the first object 2 (for example, at the through hole 22 shown in the diagram) precisely.

In the preferred embodiment of the present disclosure, the comparison device 6 is an image comparison device, vision comparison device, distance comparison device or space comparison device. Therefore, the comparison device 6 is chosen for use as needed.

Figure 18:
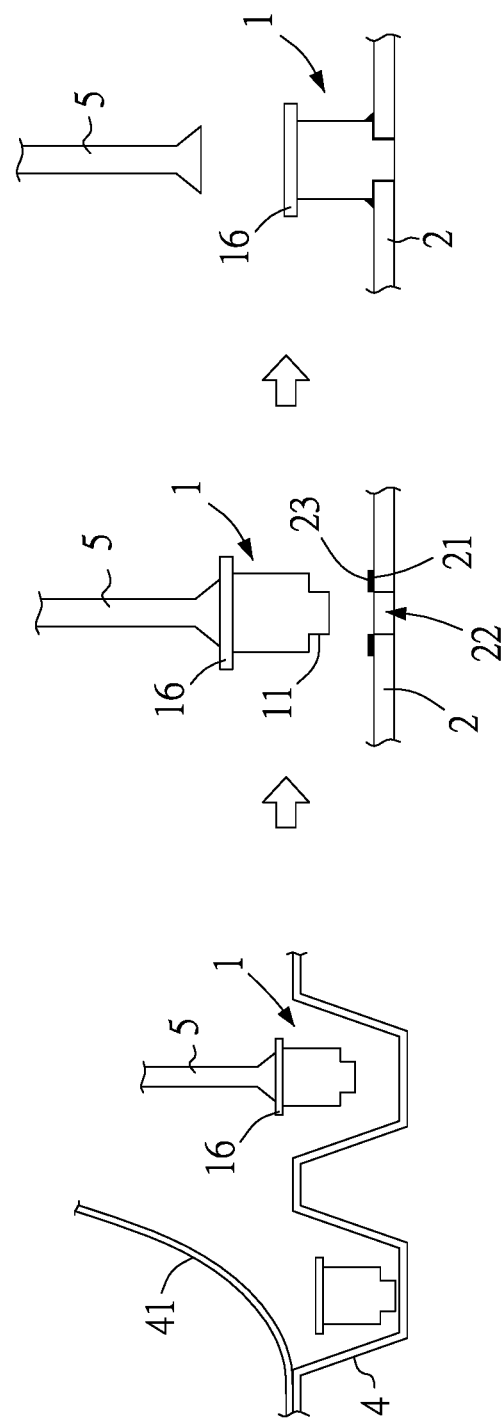
FIG. 18 is a schematic view of how to operate the fourteenth embodiment of the present disclosure.

Referring to FIG. 18, in the preferred embodiment of the present disclosure, the fastening element 1 has an intermediator 16, and the fastening element 1 is carried by a carrier 4. The fastening element 1 is taken out with the tool 5 through the intermediator 16 before being placed at the through hole 22 of the first object 2 for soldering.

In the preferred embodiment of the present disclosure, a predetermined solder layer 23 is disposed between the solderable surface 11 of the fastening element 1 and the corresponding solderable surface 21 of the first object 2 such that the solderable surface 11 of the fastening element 1 and the corresponding solderable surface 21 of the first object 2 are soldered together by the solder layer 23.

Figure 19:
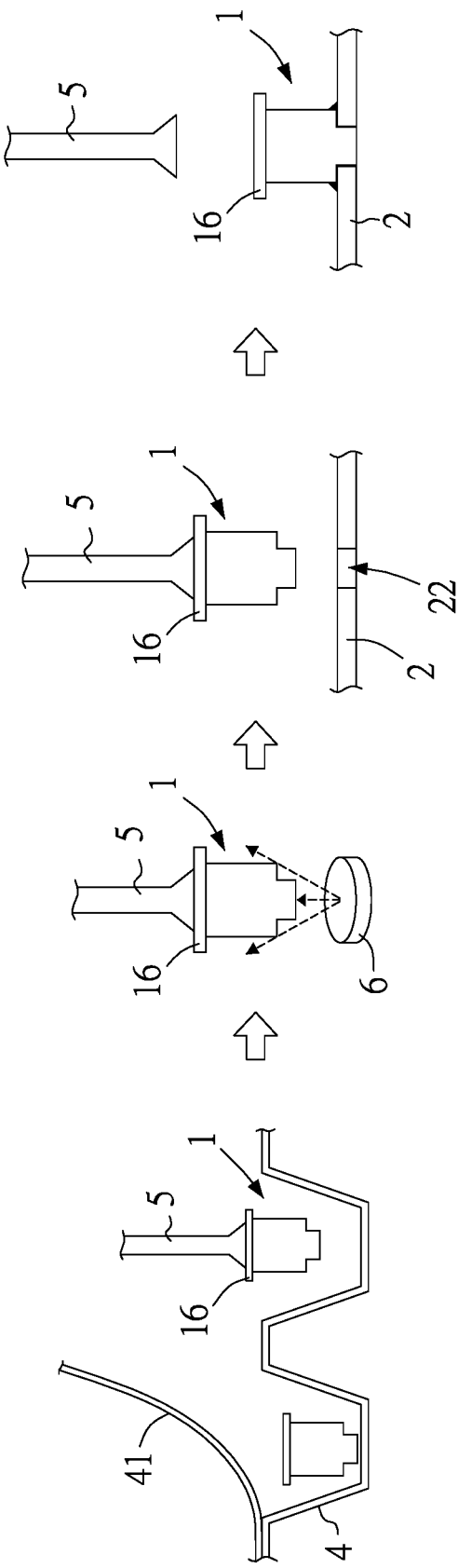
FIG. 19 is a schematic view of how to operate the fifteenth embodiment of the present disclosure.

Referring to FIG. 19, in the preferred embodiment of the present disclosure, the fastening element 1 has an intermediator 16, and the fastening element is carried by a carrier 4. The fastening element 1 is taken out with the tool 5 through the intermediator 16, and then the position of the fastening element 1 is compared with that of the first object 2 by a comparison device 6, allowing position-related information to be sent to the tool 5 to enable the tool 5 to place the fastening element 1 at a soldering point on the first object 2 (for example, at the through hole 22 shown in the diagram) precisely.

Figure 20:
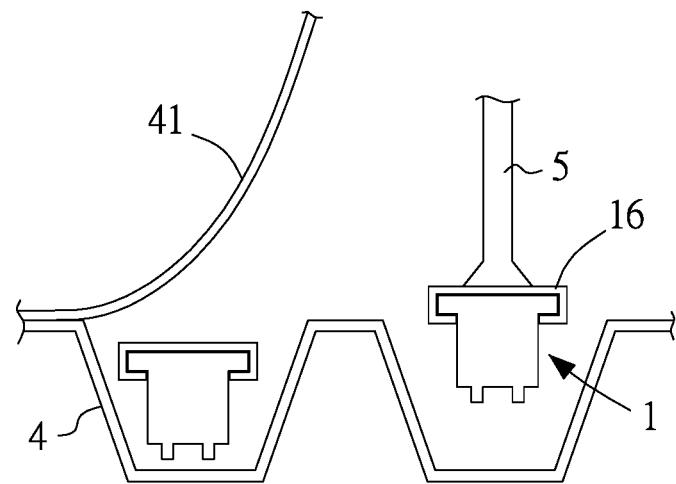
FIG. 20 is a schematic view of how to operate the sixteenth embodiment of the present disclosure.

Referring to FIG. 20, in the preferred embodiment of the present disclosure, the intermediator 16 is a second object, and the intermediator 16 is movably fastened to a hook fastening member of the fastening portion 12. The fastening element 1 is carried by a carrier 4 and taken out with the tool 5 through the intermediator 16 before being placed on the first object (not shown) for soldering.

Figure 21:
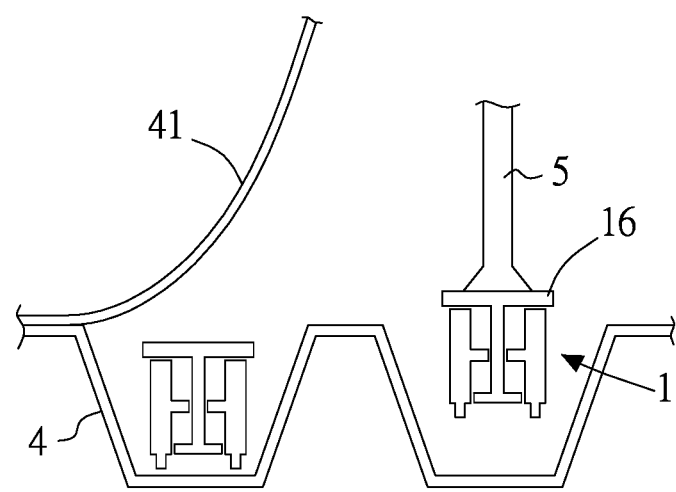
FIG. 21 is a schematic view of how to operate the seventeenth embodiment of the present disclosure.

Referring to FIG. 21, in the preferred embodiment of the present disclosure, the intermediator 16 is a second object and is movably disposed at the outer fastening member of the fastening element 1, whereas the fastening element 1 is carried by a carrier 4 and taken out with the tool 5 through the intermediator 16 before being placed on the first object (not shown) for soldering.

Figure 22:
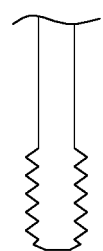
FIG. 22 is a schematic view of various forms of an intermediate layer of the present disclosure.
Figure 22:
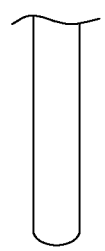
Figure 22:
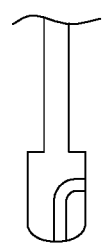

Referring to FIG. 22, in the preferred embodiment of the present disclosure, the intermediator 16 is a fastening member, a hook-and-loop member or an inserting member. The intermediator 16 is a hook fastening member or outer fastening member. The intermediator 16 which is a fastening member is a threaded fastening member (i.e., part a in the diagram), cylindrical fastening member (i.e., b in the diagram) or inner fastening member (i.e., c in the diagram) or resilient fastening member (not shown). Therefore, the intermediator 16 meets practical needs.

While the present disclosure has been described by means of specific embodiments, numerous modifications and variations could be made thereto by those skilled in the art without departing from the scope and spirit of the present disclosure set forth in the claims.

What is claimed is:

1. A structure for retaining fastening element solder, comprising a fastening element, the fastening element having a solderable surface and a fastening portion and a hole portion, wherein an end of the hole portion has a retaining portion which is grooved so solder flows into or enters during a soldering heating process to cool down and solidify, and the retaining portion in the fastening element is segmented relative to the fastening portion, and the retaining portion is a stepped portion having an inner longitudinal surface and an inner transverse surface; where solidified solder is attached to both the inner longitudinal surface and the inner transverse surface and retained in the retaining portion.

2. A structure for retaining fastening element solder, comprising a fastening element, the fastening element having a solderable surface and a fastening portion and a hole portion, wherein an end of the hole portion has a retaining portion which is grooved so solder flows into or enters during a soldering heating process to cool down and solidify, and the retaining portion in the fastening element is segmented relative to the fastening portion, and the retaining portion is oblique and has an oblique surface; where solidified solder is attached to the oblique surface and retained in the retaining portion.

3. A structure for retaining fastening element solder, comprising a fastening element, the fastening element having a solderable surface and a fastening portion and a hole portion, wherein an end of the hole portion has a retaining portion which is grooved so solder flows into or enters during a soldering heating process to cool down and solidify, and the retaining portion in the fastening element is segmented relative to the fastening portion, and the retaining portion is a stepped portion having an inner longitudinal surface and an inner transverse surface; where solidified solder is attached along the inner longitudinal surface and retained in the retaining portion.

* * * * *